US007188325B1

United States Patent
Evers et al.

(10) Patent No.: US 7,188,325 B1
(45) Date of Patent: Mar. 6, 2007

(54) METHOD FOR SELECTING TRANSISTOR THRESHOLD VOLTAGES IN AN INTEGRATED CIRCUIT

(75) Inventors: Marius Evers, Sunnyvale, CA (US); Jeffrey E. Trull, San Jose, CA (US); Alper Halbutogullari, Santa Clara, CA (US); Robert W. Williams, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 191 days.

(21) Appl. No.: 10/957,848

(22) Filed: Oct. 4, 2004

(51) Int. Cl.
    *G06F 17/50* (2006.01)
(52) U.S. Cl. ............................. 716/4; 716/2
(58) Field of Classification Search .................. 716/2, 716/4
    See application file for complete search history.

(56) References Cited

U.S. PATENT DOCUMENTS

| | | | |
|---|---|---|---|
| 6,090,153 A * | 7/2000 | Chen et al. ..................... 716/8 |
| 6,111,427 A * | 8/2000 | Fujii et al. ..................... 326/34 |
| 6,427,226 B1 | 7/2002 | Mallick et al. | |
| 6,487,701 B1 * | 11/2002 | Dean et al. ..................... 716/4 |
| 6,981,231 B2 * | 12/2005 | Xie et al. ........................ 716/2 |
| 2002/0002701 A1 * | 1/2002 | Usami et al. .................... 716/8 |
| 2003/0163792 A1 * | 8/2003 | Xie et al. ........................ 716/4 |
| 2004/0060024 A1 * | 3/2004 | Bednar et al. .................. 716/7 |
| 2004/0128631 A1 * | 7/2004 | Ditzel et al. .................... 716/2 |
| 2004/0230924 A1 * | 11/2004 | Williams et al. ................ 716/2 |
| 2004/0243958 A1 * | 12/2004 | Bednar et al. .................. 716/7 |
| 2005/0060676 A1 * | 3/2005 | Matsumura et al. ........... 716/6 |
| 2005/0097494 A1 * | 5/2005 | Kitahara et al. .............. 716/11 |
| 2005/0138588 A1 * | 6/2005 | Frenkil ........................... 716/6 |

OTHER PUBLICATIONS

David Nguyen, et al. "Minimization of Dynamic and Static Power Through Joint Assignment of Threshold Voltages and Sizing Optimization"; ISLPED '03; Aug. 25-27, 2003; pp. 158-163; Copyright 2003 ACM 1-58113-682-X/03/0008.

* cited by examiner

*Primary Examiner*—Stacy A Whitmore
(74) *Attorney, Agent, or Firm*—Meyertons Hood Kivlin Kowert & Goetzel, P.C.; B. Noël Kivlin; Stephen J. Curran

(57) ABSTRACT

In one embodiment, a method for selecting transistor threshold voltages on an integrated circuit may include assigning a first threshold voltage to selected groups of transistors such as cell instances, for example, and determining which of the selected groups of transistors to assign a second threshold voltage, that is lower than the first threshold voltage, by iteratively performing a cost/benefit analysis. The method may further include determining which of the selected groups of transistors having a third threshold voltage to assign the first threshold voltage by iteratively performing a cost/benefit analysis. The cost/benefit analysis may include calculating a cost/benefit ratio for each group of the selected groups of transistors. In addition, the cost/benefit analysis may include calculating an upcone benefit and a downcone benefit for groups of transistors coupled to one or more inputs and outputs, respectively.

21 Claims, 3 Drawing Sheets

METHOD FOR SELECTING TRANSISTOR THRESHOLD VOLTAGES IN AN INTEGRATED CIRCUIT

BACKGROUND OF THE INVENTION

1. Field of the Invention

This invention is related to the field of integrated circuits and, more particularly, to the selection of threshold voltages within an integrated circuit.

2. Description of the Related Art

Due to today's advanced integrated circuit (IC) manufacturing capabilities, an IC may include millions of transistors on a single die. Depending on the application of the IC, various types of manufacturing processes may be used. For example, one common process is a complimentary metal oxide semiconductor (CMOS) process. Another process that is becoming more popular is a silicon on insulator (SOI) process. In these and other processes, the speed at which the transistors may switch from conducting (i.e., on) to non-conducting (i.e., off) may be a function of the threshold voltage (Vt) of the transistors. For example, a transistor having a low Vt may switch faster than a transistor having a higher Vt. For speed critical applications, one might be tempted to consider using only transistors having a low Vt.

However, one drawback of a low Vt transistor is the leakage current. Depending on the process, as the Vt is reduced, the leakage current increases. Although the leakage current for CMOS and SOI processes is lower than some other processes, when an IC has millions of transistors such as in microprocessors and chip multiprocessors, for example, any increased leakage currents may add up to an unacceptable level. This may be true for mobile applications where battery life may be of particular importance as well as desktop applications where the thermal budget is a consideration. Some manufacturing processes provide circuit designers the ability to select the Vt of individual transistors or groups of transistors during IC design. However, the selection process is not always straightforward nor is it always intuitive.

SUMMARY

Various embodiments of a method for selecting transistor threshold voltages in an integrated circuit are disclosed. In one embodiment, the method may include assigning a first threshold voltage to selected groups of transistors such as cell instances, for example, and determining which groups of the selected groups of transistors to assign a second threshold voltage, that is lower than the first threshold voltage, by iteratively performing a cost/benefit analysis. The method may also include assigning a third threshold voltage, that is higher than the first threshold voltage, to all selected groups of transistors having the second threshold voltage. The method may further include determining which groups of the selected groups of transistors having the third threshold voltage to assign the first threshold voltage by iteratively performing a cost/benefit analysis. The cost/benefit analysis may include calculating a cost/benefit ratio for each group of the selected groups of transistors. In addition, the cost/benefit analysis may include calculating the benefit to the upstream cone of logic (i.e., upcone benefit) of a change in Vt for the selected groups of transistors. Further, the cost/benefit analysis may include calculating the benefit to the downstream cone of logic (i.e., downcone benefit) of a change in Vt for the selected groups of transistors.

In one specific implementation, the cost/benefit analysis may also include assigning a lower threshold voltage to a number of the selected groups of transistors having a highest priority based upon the cost/benefit ratio, the upcone benefit, and the downcone benefit of each group.

In one specific implementation, the method may further include determining path delay values of particular circuit paths including the selected groups of transistors after assigning a lower threshold voltage to the number of the selected groups of transistors.

Figure 1:
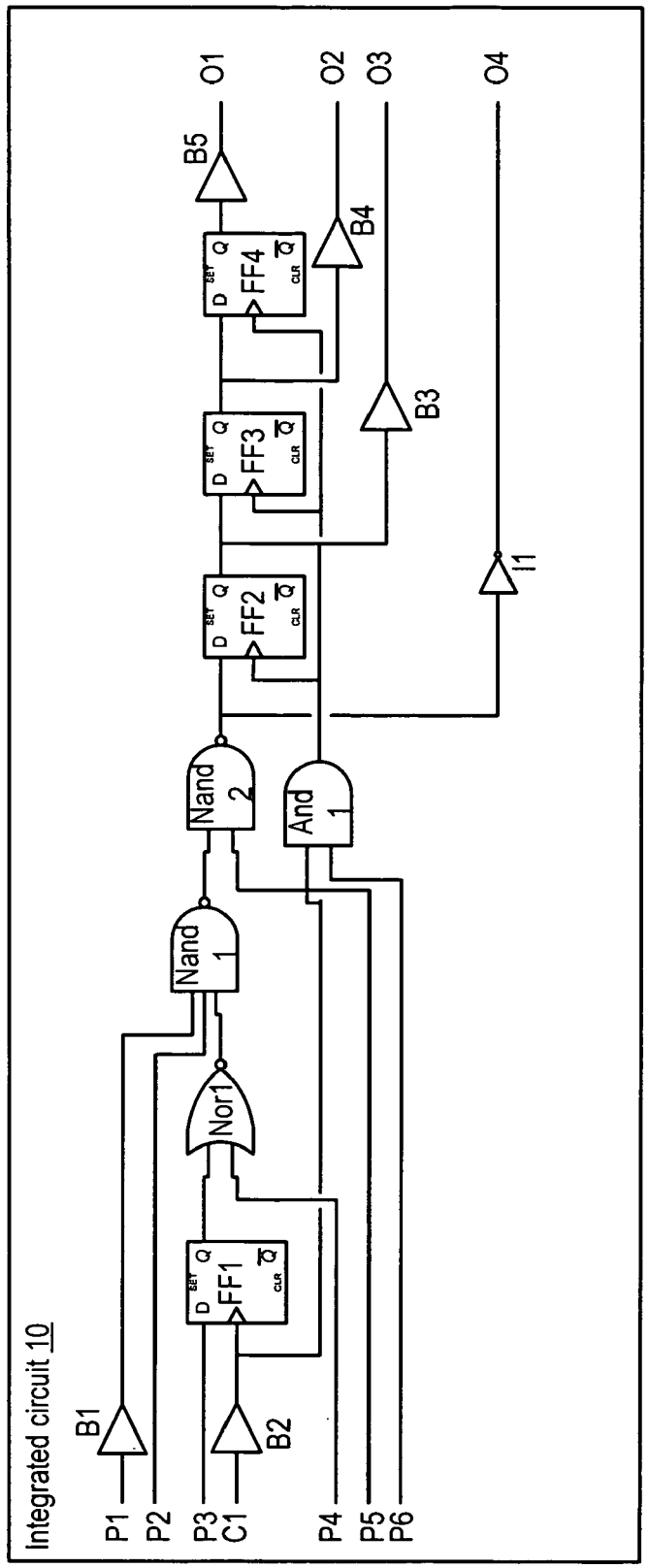
FIG. 1 is a diagram of one embodiment of an integrated circuit including various logic circuits.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include" and derivations thereof mean "including, but not limited to." The term "connected" means "directly or indirectly connected," and the term "coupled" means "directly or indirectly coupled."

DETAILED DESCRIPTION

Turning now to FIG. 1, a diagram of one embodiment of an integrated circuit (IC) including various logic circuits. Integrated circuit 10 includes a plurality of logic gates that form a plurality of paths through the logic gates. For example, there are seven input paths designated P1 through P6 and C1, and four output paths designated O1 through O4. The logic circuits include buffers designated B1 though B5, an and-gate designated And1, nand-gates designated Nand1 and Nand2, an inverter designated I1, D-type flip-flops designated FF1 through FF4, and a nor-gate designated Nor1. It is noted that the logic circuits shown are exemplary only and that in other embodiments other logic circuits may be employed as desired.

In the illustrated embodiment, the logic circuits described above (e.g., Nand1, Nor1, etc) may also be referred to as cells. Each cell may include several transistors or a group of transistors. The term cell may refer to logic functions that are included within some design library and may include standard cells from a standard cell library, for example. A particular use of a cell may be referred to as an instance, or cell instance.

One exemplary path P1, begins at the input of buffer B1 and flows through nand-gate Nand 1, nand-gate Nand 2, and inverter I1 and becomes output O4. In one embodiment, this path may be part of a much longer path that may be a critical path. A critical path is a path that has been identified to have critical timing margins. Critical paths typically have very small timing margins and thus it may be important that each cell instance only contribute a minimum delay so that the total path delay is within a given limit.

In one embodiment, each cell instance may be manufactured to have one of three threshold voltages (Vt), such as a low Vt (LVt), a medium Vt (MVt), and a high Vt (HVt). However, it is noted that in other embodiments the cell instances may be manufactured to have one of any number of Vts. For example, finer granularity may be obtained by adding Vt levels between the LVt and MVt and between MVt and HVt.

As described above, LVt transistors may have faster switching speeds and therefore present smaller path delays than higher Vt transistors. However, cell instances having an LVt may have increased static leakage currents when compared to that same cell instance having a higher Vt. Thus as described in greater detail below, an optimization method may be used to attempt to optimize which transistors (and cell instances) are selected to be LVt, MVt and HVt; thereby realizing an acceptable static leakage value for the IC and acceptable path delays particularly in critical paths.

Accordingly, an optimization method may be used to select Vts for the various cell instances in the IC based upon a cost/benefit analysis. In one embodiment, the method may be implemented as a software routine. Generally speaking, the routine may use various user inputs including a list of cell instances for which the user has predetermined the Vt level, and threshold path delay values for when use of MVt and HVt cells is allowed, for example. The method may also use static timing analysis for the design, and through an iterative process, determine which cell instances should be assigned to which Vt level.

Figure 2:
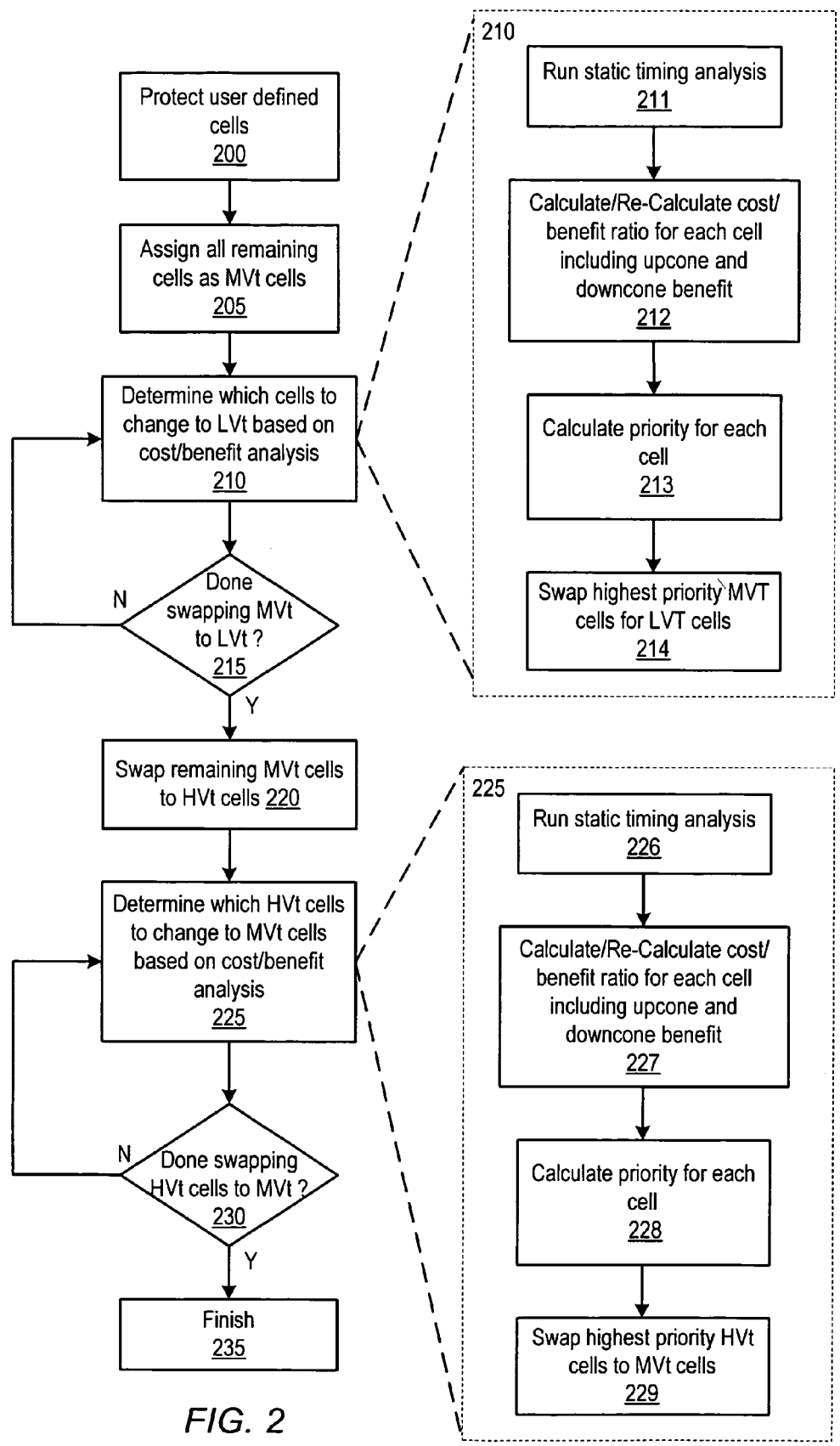
FIG. 2 is a flow diagram describing one embodiment of a method for selecting threshold voltages in an integrated circuit.

FIG. 2 illustrates a flow diagram describing one embodiment of a method of selecting threshold voltages for various cell instances of an integrated circuit. Referring collectively to FIG. 1 and FIG. 2, the method begins in block 200 where the Vt of user-defined cell instances may be identified and protected. For example, certain cell instances may be set to a particular Vt level (e.g., HVt) and may be protected from being modified. Some exemplary cell instances that may be protected include buffer B2 and and-gate And1 of FIG. 1. These gates are part of a clock-gater circuit and may have a predetermined Vt such as HVt, for example. Other examples may include cell instances that have unconstrained timing. These cell instances may be assigned to be HVt. As a starting point, all remaining non-protected cell instances may be assigned as MVt cell instances (block 205). The next task is to determine which cell instances to change from MVt to LVt. This may be accomplished using an iterative cost/benefit analysis and changing selected cell instances from MVt to LVt (block 210). The Block 210 is shown in greater detail to the right of the main flow and is described below.

In one embodiment, the cost/benefit analyses may be performed using various process corners. For example, different device libraries, which represent different process corners, may be used to calculate the cost. In one embodiment three different process corners may be: high supply voltage and fast transistors, high supply voltage and mean or typical speed transistors, and low supply voltage and typical speed transistors. In one embodiment, the analysis in block 211, 212, and 213 may be done independently for the different process corners, and the resulting MVt to LVt swaps from all corners would be applied in block 214 before iterating back to block 210 through decision block 215. Similarly the analysis in block 226, 227, and 228 would be done independently for all corners, and the resulting HVt to MVt swaps from all corners would be applied in block 229.

Once the selected cell instances have been changed, additional cost/benefit analyses may be performed. This may be done iteratively some number of times. For example, IC 10 may include two million cell instances, of which 150,000 may be selected as candidates for LVt in a first iteration. However, only a fraction of those 150,000 cell instances may be changed. Then the cost/benefit analysis may be performed again. Changing of the Vt of some cell instances may have caused other cell instances to no longer need changing. Thus, the process iteratively selects and changes those cell instances that should be changed according to the cost/benefit analysis and some user-defined threshold limits and then performs new timing analysis. In one embodiment, the number of iterations to perform may be a user-defined variable. In other embodiments the number of iterations may be a fixed value. In other embodiments the method may continue iterating until all MVt cell instances pass user-defined path delay threshold limits. If the number of times has not been reached, the iterations continue (block 215). However, if the number of iterations has been reached, the remaining MVt cell instances may be changed to use an HVt (block 220).

Additional analysis using cost/benefit calculations similar to those done in block 210 of the MVt to LVt algorithm may be performed to determine which cell instances that are currently set to use an HVt, to now change back to MVt (block 225). More particularly, in one embodiment an iterative cost/benefit analysis and subsequent changing of HVt cell instances to MVt cell instances may be performed. A more detailed illustration of block 225 is shown to the right of FIG. 2 and is described further below. It is noted that in one embodiment, all cell instances changed to LVt in block 210 may be protected from further changing in other parts of the routine (e.g., block 225).

Once the necessary number of iterations has been performed (block 230), the routine is considered complete (block 235).

Block 210 is described in greater detail. The determination of which cell instances to change from MVt to LVt includes running a static timing analysis of the IC 10 (block 211) with the cycle time set to a user defined LVt threshold (described further below). The timing analysis may yield the worst-case timing for the cell instances in the IC including any critical paths, for example. Next, a cost/benefit ratio, which includes estimating the cost and the benefit of changing a given cell instance's Vt from MVt to LVt, may be calculated for each individual cell instance. In one embodiment, the cost may be an estimate of the incremental leakage of a given cell instance if that cell instance's Vt is changed from MVt to LVt. This may be determined using transistor models in the cell library, for example. In addition, the benefit may be an estimate of the change in switching speed (or corresponding reduction in the delay) of a given cell instance if that cell instance's Vt is changed from MVt to LVt. Thus the cost/benefit ratio is the cost divided by the benefit.

In addition, each cell instance may be associated with a corresponding upstream cone of logic (referred to as the upcone) and downstream cone of logic (referred to as the downcone). The upcone corresponds to the cone of logic driving a given cell instance, including any cell instances driving the inputs to the given cell instance, any cell instances driving the inputs to those cell instances and so on until a state element or primary input is reached. The downcone refers to the cone of logic driven by a given cell instance, including each cell instance that has an input coupled to the output of the given cell instance, each cell instance that has an input coupled to the output of those cell instances and so on until a state element or primary output is reached. For example, the upcone for Nand1 includes B1, Nor1, and FF1, and the downcone for Nand1 includes Nand2, I1 and FF2. Accordingly, each cell instance may have an associated upcone and downcone benefit. The upcone benefit is a heuristic measure of the degree to which lowering the Vt of a given cell instance is likely to reduce the need for increasing the overall IC leakage by changing the Vt of other cells in the upstream cone later. Similarly, the downcone benefit is a heuristic measure of the degree to which lowering the Vt of a given cell instance is likely to reduce the need for increasing the overall IC leakage by changing the Vt of other cells in the downstream cone later.

In addition to the cost/benefit ratio for each cell instance, the benefit may be calculated for the upcone and downcone of each individual cell instance (block 212). In one embodiment, the downcone benefit for a given cell instance may be determined by calculating, for each receiver cell instance, (the receiver leakage+downcone benefit for the receiver cell instance)*proration of the receiver, and summing the results of each receiver. If the downcone benefit of the receiver is not yet known, it may be calculated recursively using the same formula with the recursion ending when a state point or primary output is reached. In another embodiment, the receiver leakage may be multiplied by the absolute value of the slack of the receiver input pin in the above formula. However, if the slack of the receiver input pin is larger than zero, its contribution to the downcone benefit will be considered zero. The proration may be a scaling factor that scales the contribution of the receiver dependent upon whether the receiver input is a critical input. For example, in one embodiment, the proration value may be the slack of the input/the worst input slack of the receiver cell instance. In another embodiment, the proration value may be one if the input slack is equal to the worst input slack of the receiver and zero otherwise.

The upcone benefit for a given cell instance may be determined by calculating, for each input pin, (the driver cell leakage+upcone benefit for the driver cell)*proration of the driver, and summing the results of each driver. If the upcone benefit of the driver is not yet known, it may be calculated recursively using the same formula with the recursion ending when a state point or primary input is reached. In another embodiment, the driver leakage may be multiplied by the absolute value of the slack of the input pin of the given cell in the above formula. However, if the slack of the input pin of the given cell is larger than zero, its contribution to the upcone benefit will be considered zero. The proration may be a scaling factor that scales the contribution of the driver dependent upon whether the input is the critical output of the driver. For example, in one embodiment, the proration value may be the slack of the input of the given cell/the worst output slack of the driver cell. In another embodiment, the proration value may be one if the input slack is equal to the worst output slack of the driver cell and zero otherwise. It is noted that in one embodiment, as each cell instance's upcone and downcone benefits are calculated, the values may be saved so that the values for each cell instance may be calculated only once per iteration. The slack of a pin or cell instance refers to margin of the worst path through that pin or cell instance has to the cycle time, (cycle time–delay of worst path through pin or cell instance).

Once the cost/benefit analysis is complete, a priority may be calculated for each cell instance dependent upon the cost/benefit ratio of each cell instance and its associated upcone and downcone benefits (block 213). For example, in one embodiment, the priority of each cell instance=(benefit/cost)*(upcone benefit+downcone benefit). A higher number gives a higher priority. The cost/benefit calculation and the upcone and downcone benefit calculation need only be done for cell instances with slack less than zero. If the calculated priority is less than or equal to zero, the cell instance is not placed on the priority list. The priorities may be used to create a priority list that may include all cell instances that are candidates to be changed from MVt to LVt. This priority list may be created each iteration.

Some number of the cell instances on the priority list may be changed from Mvt to LVt (block 214). In one embodiment, a user-determined, fixed percentage (e.g., 20%) of the cell instances on the priority list may be changed. In other embodiments, a fixed number of cell instances from the priority list may be changed. In addition, in one embodiment, after the last iteration of the cost/benefit analysis has been performed, all cell instances on the current priority list may be changed from MVt to LVt.

Block 225 includes blocks 226–229. It is noted that blocks 226–229 perform operations that are substantially identical to the operations performed in blocks 211–214 with some exceptions, which are described below. For example, the static timing analysis of block 226 is substantially the same as that performed in block 211, except in block 226, the cycle time may be set to a user defined HVt threshold instead of a user defined LVt threshold. In addition, the cost and benefit computation is based on changing the cell instance from an HVt to an MVt instead of from MVt to LVt. Further, in block 229, some number of the highest priority cell instances may be changed from an HVt to an MVt instead of from MVt to LVt. Since the remaining operation of blocks 226–229 may be the same as the operation of blocks 211–214, the corresponding description may be found in the descriptions of blocks 211–214 above.

It is noted that although the embodiments described above include running the static timing analysis after swapping some number of cell instances in priority lists from either MVt to LVt or HVt to MVt, it is noted that in other embodiments it is contemplated that the static timing analysis may be performed after selecting and changing one cell instance or a only a few high priority cell instances. In this way, cell instances may be selected for change with a finer granularity. Since, each time a cell instance is changed, there may be a noticeable change in the total path timing, it may be possible to reduce the number of cell instances that are changed to LVt or MVt. Thus, the static leakage may be reduced while obtaining acceptable path delays.

In one embodiment, there may be three threshold voltages supported (e.g. LVt, MVt, and HVt). In such an embodiment, there may be two threshold limits (e.g. an LVt threshold, and an HVt threshold) which may be user-defined inputs. The LVt threshold may represent the maximum path delay for a given path in which Mvt cell instances may be used. The HVt threshold may represent the maximum path delay for a given path in which HVt cell instances may be used. The threshold limits may, but need not be different.

In various other embodiments, there may be any number (n) of threshold voltages. In such embodiments, there may be n−1 threshold limits. The first threshold limit represents the maximum path delay above which only cell instances with the lowest Vt may be used. The second threshold limit represents the maximum path delay above which only cell instances with the two lowest Vt levels may be used and so on. Accordingly, optimization may be performed when any number of Vt levels are supported by successively optimizing for each Vt level starting from the lowest and ending with the second highest. This is similar to optimization described in FIG. 2 where three Vt levels are supported and the cells that need to have the lowest Vt level were found first and the cells that need to have the second lowest Vt level were found second.

Figure 3:
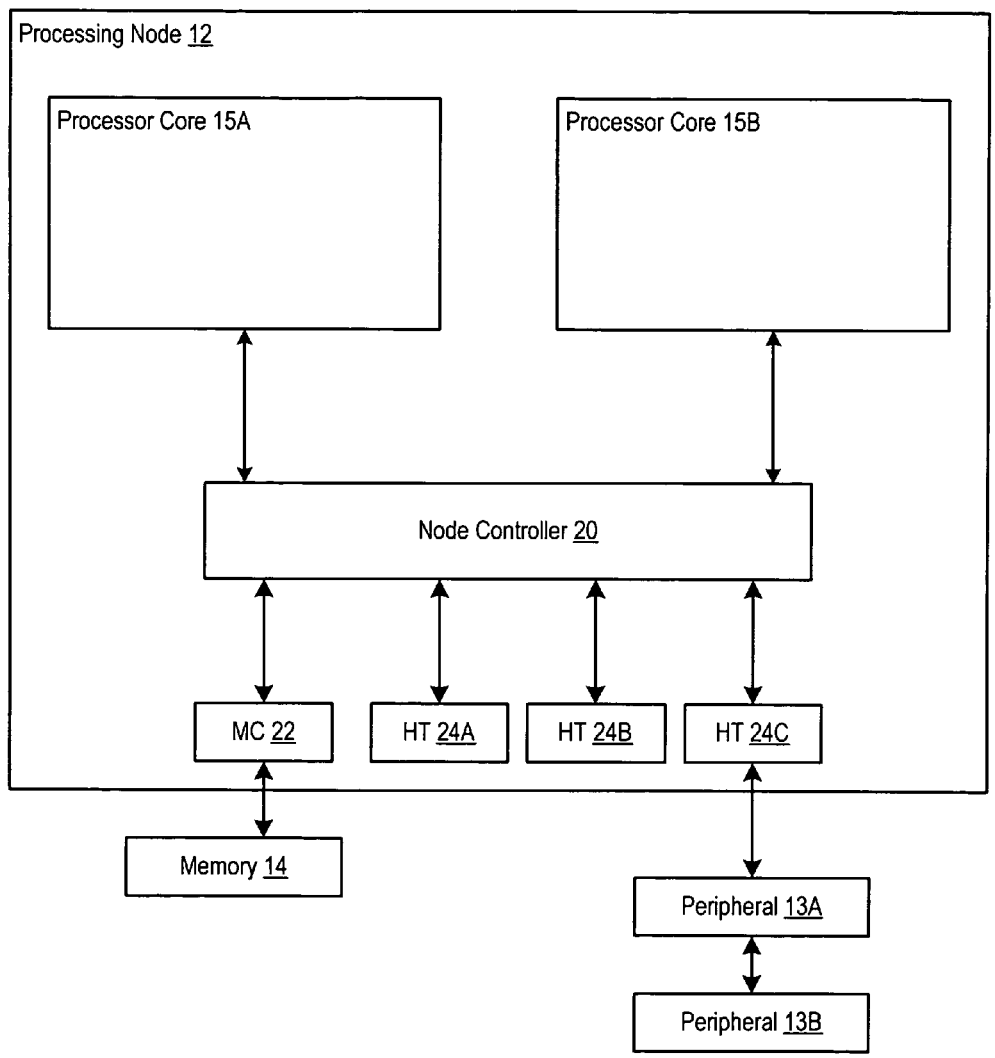
FIG. 3 is a block diagram of one embodiment of a computer system including a chip multiprocessor node.

Turning now to FIG. 3, a block diagram of one embodiment of a computer system 10 is shown. In the illustrated embodiment, the computer system 10 includes a processing node 12 coupled to memory 14 and to peripheral devices 13A–13B. The node 12 includes processor cores 15A–15B coupled to a node controller 20 which is further coupled to a memory controller 22 and a plurality of HyperTranspor™ (HT) interface circuits 24A–24C. The processor cores 15A–15B are also coupled to configuration unit 50, which is in turn coupled to a memory built-in self-test unit (MBIST) 75. The HT circuit 24C is coupled to the peripheral device 13A, which is coupled to the peripheral device 13B in a daisy-chain configuration (using HT interfaces, in this embodiment). The remaining HT circuits 24A–B may be connected to other similar processing nodes (not shown) via other HT interfaces (not shown). The memory controller 22 is coupled to the memory 14. In one embodiment, node 12 may be a single integrated circuit chip including circuitry similar to that shown in FIG. 1. As such, the threshold voltage of the various circuits of FIG. 3 may be determined and selected as described above in conjunction with the descriptions of FIG. 1 and FIG. 2. Other embodiments may implement the node 12 as two or more separate integrated circuits, as desired. Any level of integration or discrete components may be used.

It is also noted that the embodiments described above may be implemented as a software routine including program instructions that may be executed by one or more processors such as processor node 12, for example. Various embodiments may further include receiving, sending or storing the program instructions and/or data implemented in accordance with the foregoing description upon a carrier medium. Generally speaking, a carrier medium may include storage media or memory media such as magnetic or optical media, e.g., disk or CD-ROM, volatile or non-volatile media such as RAM (e.g. SDRAM, DDR SDRAM, RDRAM, SRAM, etc.), ROM, etc. as well as transmission media or signals such as electrical, electromagnetic, or digital signals, conveyed via a communication medium such as network and/or a wireless link.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method of selecting transistor threshold voltages on an integrated circuit, the method comprising:
   assigning a first threshold voltage to selected groups of transistors;
   determining which of the selected groups of transistors to assign a second threshold voltage by iteratively performing a cost/benefit analysis and calculating a first priority for each group of the selected groups of transistors, wherein the second threshold voltage is lower than the first threshold voltage;
   assigning the second threshold voltage, based upon the first priority, to at least a portion of the selected groups of transistors in response to determining which of the selected groups of transistors to assign the second threshold voltage;
   assigning a third threshold voltage to all remaining selected groups of transistors not having the second threshold voltage, wherein the third threshold voltage is higher than the first threshold voltage; and
   determining which of the remaining selected groups of transistors having the third threshold voltage to assign the first threshold voltage by iteratively performing a cost/benefit analysis and calculating a second priority for each of the remaining selected groups of transistors;
   assigning the first threshold voltage, based upon the second priority, to at least a subset of the remaining portion of the selected groups of transistors having the third threshold voltage in response to determining which of the remaining selected groups of transistors having the third threshold voltage to assign the first threshold voltage;
   wherein performing a cost/benefit analysis includes:
      calculating a cost/benefit ratio for each group of the selected groups of transistors;
      calculating an upcone benefit for groups of transistors coupled to one or more inputs of each group of the selected groups of transistors; and
      calculating a downcone benefit for groups of transistors coupled to an output of each group of the selected groups of transistors.

2. The method as recited in claim 1, wherein determining which of the selected groups of transistors to assign the second threshold voltage and the first threshold voltage further includes assigning a lower threshold voltage to a number of the selected groups of transistors having a highest priority, wherein each of the first and the second priorities is based upon the cost/benefit ratio, the upcone benefit, and the downcone benefit of each group while assigned to their respective threshold voltage.

3. The method as recited in claim 2, wherein the number of the selected groups of transistors having a highest priority includes a percentage of the selected groups of transistors having a highest priority.

4. The method as recited in claim 2, further comprising determining path delay values of particular circuit paths including the selected groups of transistors after assigning a lower threshold voltage to the number of the selected groups of transistors.

5. The method as recited in claim 4, wherein the number of the selected groups of transistors is one.

6. The method as recited in claim 1, wherein calculating the cost/benefit ratio of each group of the selected groups of transistors includes determining a corresponding increase in the leakage current value for each group of the selected groups of transistors in response to lowering the threshold voltage.

7. The method as recited in claim 1, wherein calculating the cost/benefit ratio of each group of the selected groups of transistors includes determining a corresponding decrease in a path delay of each group of the selected groups of transistors in response to lowering the threshold voltage.

8. The method as recited in claim 1, wherein the priority of each group of the selected groups of transistors is substantially equal to (the benefit divided by the cost) multiplied by (the upcone benefit added to the downcone benefit).

9. The method as recited in claim 1, wherein each group of transistors is a cell.

10. A computer readable medium including program instructions, wherein the program instructions are executable by a processor to:
   assign a first threshold voltage to selected groups of transistors;
   determine which of the selected groups of transistors to assign a second threshold voltage by iteratively performing a cost/benefit analysis and calculate a first priority for each group of the selected groups of transistors, wherein the second threshold voltage is lower than the first threshold voltage;
   assign the second threshold voltage, based upon the first priority, to at least a portion of the selected groups of transistors in response to determining which of the selected groups of transistors to assign the second threshold voltage,
   assign a third threshold voltage to all remaining selected groups of transistors not having the second threshold voltage, wherein the third threshold voltage is higher than the first threshold voltage; and
   determine which of selected groups of transistors having the third threshold voltage to assign the first threshold voltage by iteratively performing a cost/benefit analysis and calculating a second priority for each of the remaining selected groups of transistors;
   assign the first threshold voltage, based upon the second priority, to at least a subset of the remaining portion of the selected groups of transistors having the third threshold voltage in response to determining which of the remaining selected groups of transistors having the third threshold voltage to assign the first threshold voltage;
   wherein performing the cost/benefit analysis includes:
      calculating a cost/benefit ratio for each group of the selected groups of transistors;
      calculating an upcone benefit for groups of transistors coupled to one or more inputs of each group of the selected groups of transistors; and
      calculating a downcone benefit for groups of transistors coupled to an output of each group of the selected groups of transistors.

11. The carrier medium as recited in claim 10, wherein the program instructions are further executable by the processor to assign a lower threshold voltage to a number of the selected groups of transistors having a highest priority, wherein each of the first and the second priorities based upon the cost/benefit ratio, the upcone benefit, and the downcone benefit of each group while assigned to their respective threshold voltage.

12. The carrier medium as recited in claim 11, wherein the number of the selected groups of transistors having a highest priority includes a percentage of the selected groups of transistors having a highest priority.

13. The carrier medium as recited in claim 11, wherein the program instructions are further executable by the processor to determine path delay values of particular circuit paths including the selected groups of transistors after assigning a lower threshold voltage to the number of the selected groups of transistors.

14. The carrier medium as recited in claim 13, wherein the number of the selected groups of transistors is one.

15. The carrier medium as recited in claim 10, wherein calculating the cost/benefit ratio of each group of the selected groups of transistors includes determining a corresponding increase in the leakage current value for each group of the selected groups of transistors in response to lowering the threshold voltage.

16. The carrier medium as recited in claim 10, wherein calculating the cost/benefit ratio of each group of the selected groups of transistors includes determining a corresponding decrease in a path delay of each group of the selected groups of transistors in response to lowering the threshold voltage.

17. The carrier medium as recited in claim 10, wherein the priority of each group of the selected groups of transistors is substantially equal to (the benefit divided by the cost) multiplied by (the upcone benefit added to the downcone benefit).

18. A system comprising:
   a memory configured to store program instructions; and
   a processor coupled to the memory and configured to execute the program instructions;
   wherein when executed by the processor, the program instructions are configured to:
      assign a first threshold voltage to selected groups of transistors;
      determine which of the selected groups of transistors to assign a second threshold voltage by iteratively performing a cost/benefit analysis and calculate a first priority for each group of the selected groups of transistors, wherein the second threshold voltage is lower than the first threshold voltage;
      assign the second threshold voltage, based upon the first priority, to at least a portion of the selected groups of transistors in response to determining which of the selected groups of transistors to assign the second threshold voltage;
      assign a third threshold voltage to all remaining selected groups of transistors not having the second threshold voltage, wherein the third threshold voltage is higher than the first threshold voltage; and
      determine which of selected groups of transistors having the third threshold voltage to assign the first threshold voltage by iteratively performing a cost/benefit analysis and calculating a second priority for each of the remaining selected groups of transistors;
      assign the first threshold voltage, based upon the second priority, to at least a subset of the remaining portion of the selected groups of transistors having the third threshold voltage in response to determining which of the remaining selected groups of transistors having the third threshold voltage to assign the first threshold voltage;
   wherein performing the cost/benefit analysis includes:
      calculating a cost/benefit ratio for each group of the selected groups of transistors;
      calculating an upcone benefit for groups of transistors coupled to one or more inputs of each group of the selected groups of transistors; and
      calculating a downcone benefit for groups of transistors coupled to an output of each group of the selected groups of transistors.

19. The system as recited in claim 18, wherein the program instructions are further executable by the processor to assign a lower threshold voltage to a number of the selected groups of transistors having a highest priority, wherein each of the first and the second priorities based upon the cost/benefit ratio, the upcone benefit, and the downcone benefit of each group while assigned to their respective threshold voltage.

20. The system as recited in claim 19, wherein the number of the selected groups of transistors having a highest priority includes a percentage of the selected groups of transistors having a highest priority.

21. The system as recited in claim 19, wherein the program instructions are further executable by the processor to determine path delay values of particular circuit paths including the selected groups of transistors after assigning a lower threshold voltage to the number of the selected groups of transistors.

* * * * *